(12) United States Patent
Lee et al.

(10) Patent No.: US 12,130,551 B2
(45) Date of Patent: Oct. 29, 2024

(54) PELLICLE FRAME WITH STRESS RELIEF TRENCHES

(71) Applicant: Taiwan Semiconductor Manufacturing Company, Ltd., Hsinchu (TW)

(72) Inventors: Kuo-Hao Lee, Hsinchu (TW); You-Cheng Jhang, Changhua (TW); Han-Zong Pan, Hsinchu (TW); Jui-Chun Weng, Taipei (TW); Chiu-Hua Chung, Hsinchu (TW); Sheng-Yuan Lin, Hsinchu (TW); Hsin-Yu Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/335,232

(22) Filed: Jun. 15, 2023

(65) Prior Publication Data

US 2023/0324787 A1    Oct. 12, 2023

Related U.S. Application Data

(63) Continuation of application No. 17/815,328, filed on Jul. 27, 2022, now Pat. No. 11,726,401, which is a continuation of application No. 17/021,778, filed on Sep. 15, 2020, now Pat. No. 11,415,878.

(51) Int. Cl.
G03F 1/64    (2012.01)
G03F 1/62    (2012.01)
G03F 7/00    (2006.01)

(52) U.S. Cl.
CPC ............... G03F 1/64 (2013.01); G03F 1/62 (2013.01); *G03F 7/70983* (2013.01)

(58) Field of Classification Search
CPC ................................... G03F 1/62; G03F 1/64
USPC ........................................................... 430/5
See application file for complete search history.

(56) References Cited

U.S. PATENT DOCUMENTS

| | | |
|---|---|---|
| 9,841,670 B2 | 12/2017 | Kohmura et al. |
| 10,649,326 B2 | 5/2020 | Nishimura |
| 11,415,878 B2 | 8/2022 | Lee et al. |
| 2018/0017860 A1 | 1/2018 | Ishito |
| 2022/0365424 A1 | 11/2022 | Lee et al. |

*Primary Examiner* — Christopher G Young

(74) *Attorney, Agent, or Firm* — Harrity & Harrity, LLP

(57) ABSTRACT

A photomask assembly may be formed such that stress relief trenches are formed in a pellicle frame of the photomask assembly. The stress relief trenches may reduce or prevent damage to a pellicle that may otherwise result from deformation of the pellicle. The stress relief trenches may be formed in areas of the pellicle frame to allow the pellicle frame to deform with the pellicle, thereby reducing the amount damage to the pellicle caused by the pellicle frame.

20 Claims, 14 Drawing Sheets

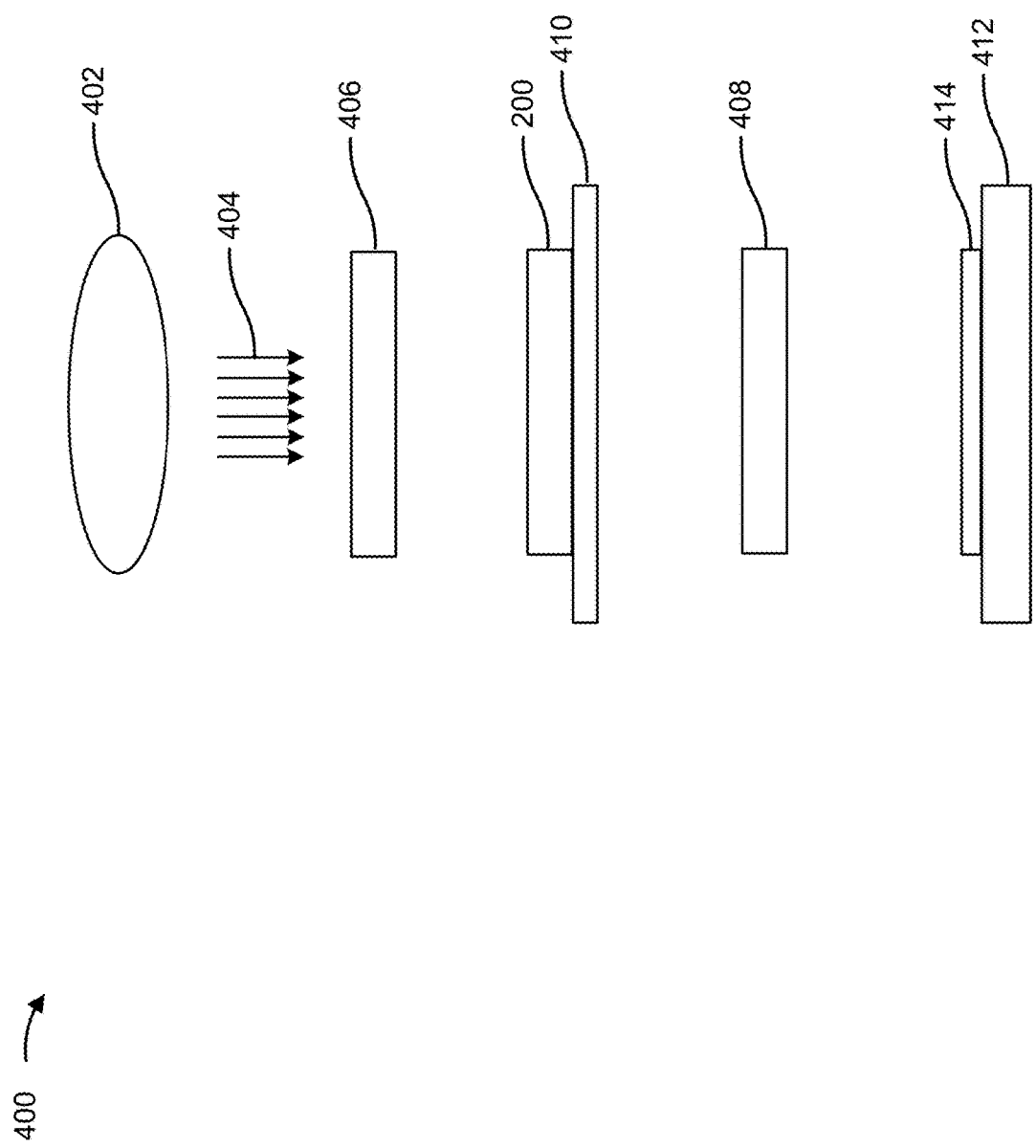

PELLICLE FRAME WITH STRESS RELIEF TRENCHES

CROSS-REFERENCE TO RELATED APPLICATIONS

This application is a continuation of U.S. patent application Ser. No. 17/815,328, filed Jul. 27, 2022, which claims priority to U.S. patent application Ser. No. 17/021,778, filed on Sep. 15, 2020, the contents of which are incorporated herein by reference in their entireties.

BACKGROUND

A photomask assembly is an apparatus that is used to transfer a pattern (e.g., a die layer pattern, an integrated circuit pattern, and/or the like) to a wafer. A photomask assembly may include a photomask on which a pattern is formed, and a pellicle layer to protect the pattern from damage and dust that could otherwise cause defects in the transfer of the pattern to a substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a diagram of an example exposure tool.

DETAILED DESCRIPTION

Figure 1:
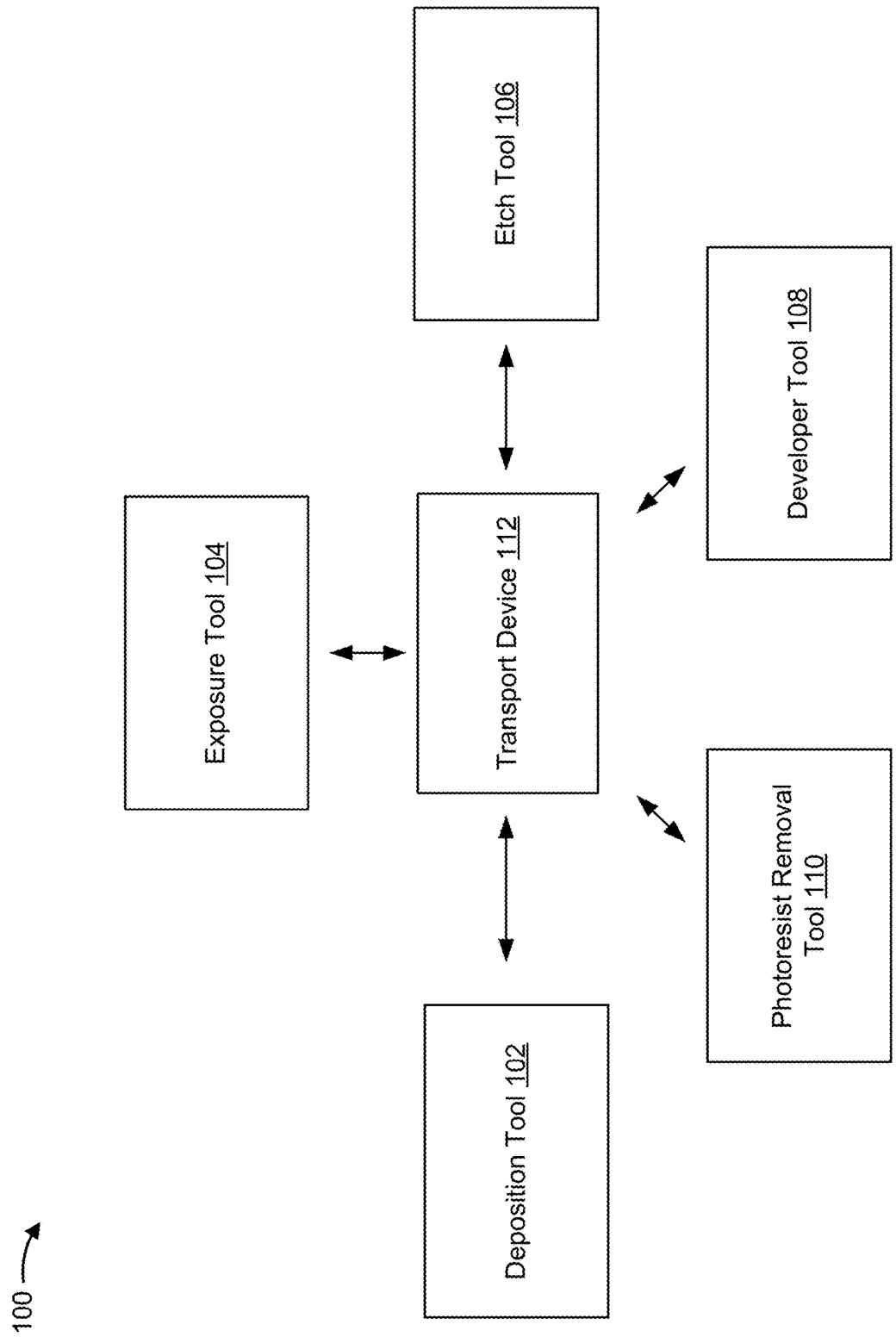
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A pellicle may be mounted on a pellicle frame, which separates the pellicle from a photomask. During a lithography process, in which a processing chamber is pumped down or pressurized to a vacuum, the high pressure may cause the pellicle to deform. In some cases, the deformation of the pellicle may be severe enough to result in the pellicle being pressed against the pellicle frame, which can rupture the pellicle and cause other types of damage to the pellicle.

Some implementations described herein provide a photomask assembly that is formed such that stress relief trenches are formed in a pellicle frame of the photomask assembly. The stress relief trenches may reduce or prevent damage to a pellicle that may otherwise result from deformation of the pellicle. The stress relief trenches may be formed in areas of the pellicle frame to allow the pellicle frame to deform with the pellicle, thereby reducing the amount damage to the pellicle caused by the pellicle frame.

FIG. 1 is a diagram of an example environment 100 in which systems and/or methods described herein may be implemented. As shown in FIG. 1, environment 100 may include a plurality of semiconductor processing tools 102-110 and a transport device 112. The plurality of semiconductor processing tools 102-106 may include a deposition tool 102, an exposure tool 104, an etch tool 106, a developer tool 108, a photoresist removal tool 110, and/or other the like. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a chemical vapor deposition (CVD) tool, such as an atomic layer deposition (ALD) tool, an epitaxy tool, a metal organic CVD (MOCVD) tool, a plasma-enhanced CVD (PECVD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose the photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The etch tool 106 is a semiconductor processing tool that is capable of etching various types of materials of a substrate, wafer, or semiconductor device. For example, the etch tool 106 may include a wet etch tool, a dry etch tool, and/or the like. In some implementations, the etch tool 106 includes a chamber that is filled with an etchant, and the substrate is placed in the chamber for a particular time period to remove particular amounts of one or more portions of the substrate. In some implementations, the etch tool 106 may etch one or more portions of a the substrate using a plasma etch or a plasma-assisted etch, which may involve using an ionized gas to isotopically or directionally etch the one or more portions.

The developer tool 108 is a semiconductor processing tool that is capable of developing a photoresist layer that has been exposed to a radiation source to develop a pattern transferred to the photoresist layer from the exposure tool 104. In some implementations, the developer tool 108 develops a pattern by removing unexposed portions of a photoresist layer. In some implementations, the developer tool 108 develops a pattern by removing exposed portions of a photoresist layer. In some implementations, the developer tool 108 develops a pattern by dissolving exposed or unexposed portions of a photoresist layer through the use of a chemical developer.

The photoresist removal tool 110 is a semiconductor device that is capable of removing remaining portions of a photoresist layer from a substrate after the etch tool 106 removes portions of the substrate. For example, the photo resist removal tool 110 may use a chemical stripper and/or another technique to remove a photoresist layer from a substrate.

Transport device 112 includes a mobile robot, a robot arm, a tram or rail car, and/or another type of device that are used to transport photomask assemblies (or components thereof), wafers, and/or dies between semiconductor processing devices 102-110 and/or to and from other locations such as a wafer rack, a storage room, and/or the like. In some implementations, transport device 112 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
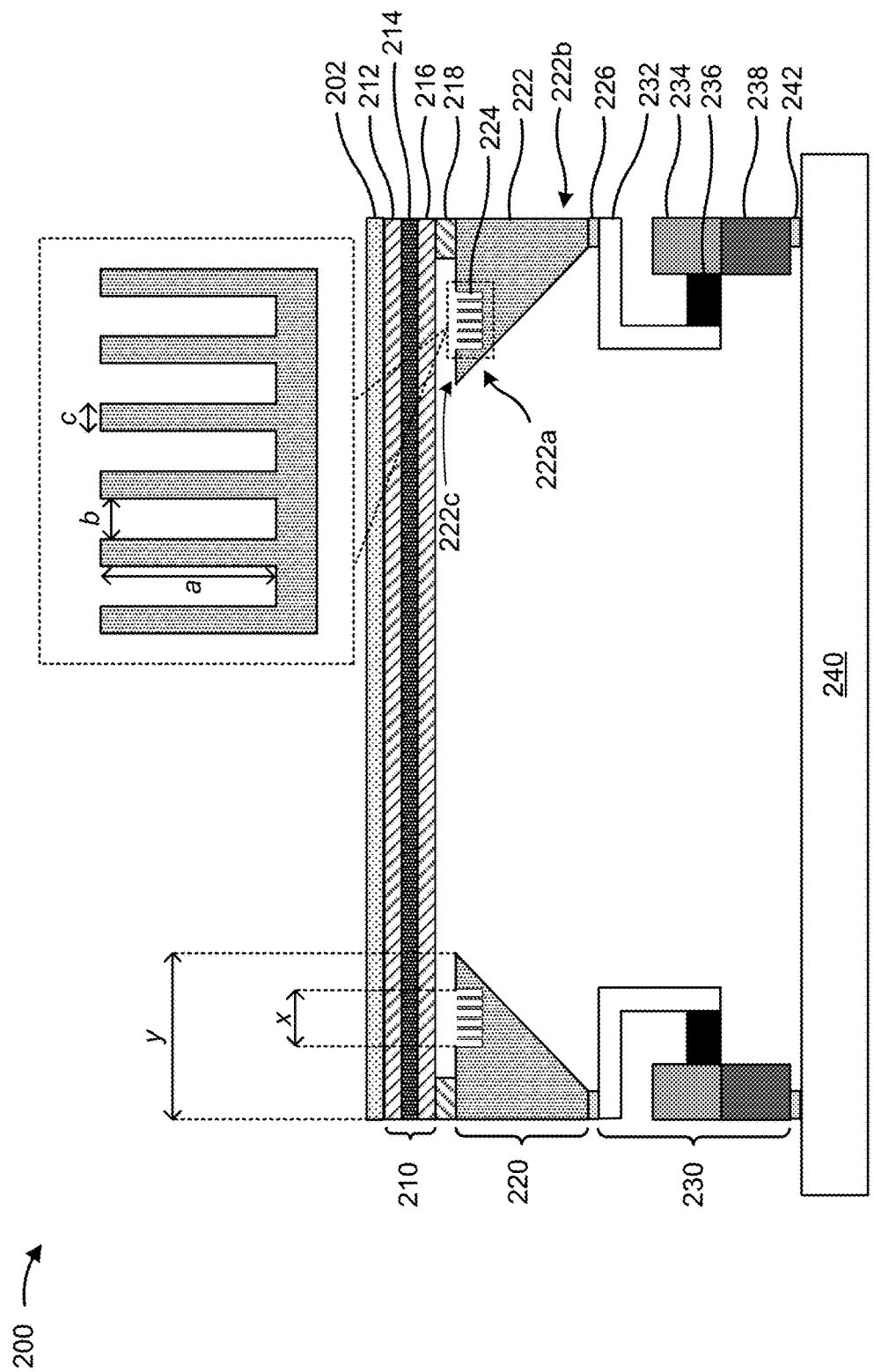
FIG. 2 is a diagram of an example photomask assembly described herein.

FIG. 2 is a diagram of a cross-sectional view of an example photomask assembly 200 described herein. The photomask assembly 200 may be an apparatus that is used to transfer a pattern (e.g., a die layer pattern, an integrated circuit pattern, and/or the like) to a wafer. In some implementations, the photomask assembly 200 may be used in an exposure tool (e.g., exposure tool 104). As shown in FIG. 2, the photomask assembly 200 may include various components and/or subsystems, such as a cooling layer 202, a pellicle 210, a pellicle frame 220, a photomask frame 230, and a photomask 240, among other examples.

The cooling layer 202 includes a layer of material that dissipates heat generated during a lithography patterning process. The heat dissipation properties of the cooling layer 202 may reduce warpage, deformation, and/or other heat-related degradations. In some implementations, the cooling layer 202 includes ruthenium (Ru), a carbon-based material (e.g., graphite, grapheme, diamond, carbon nanotube, and/or the like), or another thermally conductive material. The cooling layer 202 may have a thickness ranging from approximately 3 nanometers (nm) to approximately 10 nm.

The pellicle 210 may include a plurality of layers that may perform different functions, such as a capping layer 212 on a function layer 214, and another capping layer 216 on which the function layer 214 is formed. The pellicle 210 protects the photomask from particles and other debris, and keeps the particles and other debris out of focus in the exposure tool so that the particles and other debris do not produce a patterned image, which may cause defects to be transferred to the wafer.

The capping layers 212 and 216 may protect the function layer 214 from chemicals and/or particles. For example, the function layer 214 may be formed of silicon, which may be susceptible to environmental chemicals and/or particles. In some implementations, the capping layers 212 and 216 are formed of a silicon oxide ($SiO_x$), a silicon nitride ($SiN_x$), a silicon carbide ($SiC_x$), or a mixture thereof, such as a silicon carbon nitride (SiCN), a silicon oxynitride (SiON), and/or the like. In some implementations, the capping layers 212 and 216 include boron nitride (BN) or borin carbide (BC). The capping layers 212 and 216 are thin without degrading the transparency of the pellicle 210. In some examples, the thickness of the capping layers range from approximately 3 nm to approximately 10 nm. In some examples, the thickness of each of the capping layers 212 and 216 is approximately 5 nm with a variation of approximately 10% or less.

The function layer 214 may include one or more materials including silicon, such as polycrystalline silicon (poly-Si), amorphous silicon (a-Si), doped silicon (such as phosphorous doped silicon (SiP)), or a silicon-based compound. Alternatively, the function layer 214 includes a polymer, grapheme, or other suitable material. The function layer 214 may be formed to a thickness such that the function layer 214 has sufficient mechanical strength while not degrading the transparency of the function layer 214. In some examples, the function layer 214 may have a thickness ranging from approximately 30 nm to approximately 50 nm.

The pellicle 210 may be attached, bonded, glued, or otherwise secured to the pellicle frame 220 by a buffer layer 218. The buffer layer 218 may be formed of an adhesive material such as a thermal plastic elastomer or other macromolecular adhesive material cured by heat or drying. In some implementations, the buffer layer 218 includes Styrene Ethylene/Butylene Styrene rubber (SEBS), Thermoplastic Polyester Elastomer (TPE), polyether urethane (TPU), Thermoplastic Olefinic elastomer (TPO), Thermoplastic Vulcanisate (TPV), or another adhesive material.

The pellicle frame 220 may be a mounting structure on which the pellicle 210 is mounted via the buffer layer 218. The pellicle frame 220 may be formed of silicon, a silicon oxide ($SiO_x$), or another material having sufficient rigidity to support the pellicle 210 (e.g., during lithography patterning process). As shown in FIG. 2, the pellicle frame 220 may have a plurality of surfaces 222, such as an inner surface 222a (e.g., which may be angled, straight, curved, or formed of a different geometry), an outer surface 222b, and a top surface 222c facing the pellicle 210.

The pellicle 210 may be bonded to the top surface 222c of the pellicle frame 220. In particular, the capping layer 216 of the pellicle 210 may be bonded to an outer portion of the top surface 222c (e.g., a portion of the top surface 222c toward or located near the outer surface 222b) via the buffer layer 218. As further shown in FIG. 2, the pellicle frame 220 may include one or more stress relief trenches 224. The one or more stress relief trenches 224 may be formed in the top surface 222c of the pellicle frame 220. In particular, the one or more stress relief trenches 224 may be formed in an inner portion of the top surface 222c (e.g., a portion of the top surface 222c toward or located near the inner surface) adjacent to the outer portion in which the pellicle 210 is attached to the pellicle frame 210.

The one or more stress relief trenches 224 may provide stress relief for the pellicle 210 during operation of the exposure tool (e.g., during a lithography patterning process). In particular, the one or more stress relief trenches 224 permit the inner portion of the pellicle frame 210 to bend or deform along with the pellicle 210 when the pellicle 210 contacts the pellicle frame 220 (e.g., due to deformation of the pellicle 210). The deformation of the pellicle frame 220 resulting from the one or more stress relief trenches 224 reduces the amount of force or pressure applied to or exerted on the pellicle 210, for example, when the photomask assembly 200 is used in an exposure tool (in particular, when the exposure tool is pressurized to a vacuum).

As shown in FIG. 2, the width x across the one or more stress relief trenches 224 may span a portion of the width y of top surface 222c of the pellicle frame 220. For example, the width y of the top surface 220 of the pellicle frame 220 may be in a range from approximately 1 millimeters (mm) to approximately 5 mm, whereas the width x across the one or more stress relief trenches 224 may be in a range from approximately 5 microns ($\mu$m) to approximately 10 $\mu$m. Moreover, as shown in the close-up view in FIG. 2, each stress relief trench 224 may have a depth a and width b. In some implementations, the depth a of a stress relief trench 224 is greater than the width b of the stress relief trench 224. In some implementations, the depth a of a stress relief trench 224 is approximately equal to the width b of the stress relief trench 224. In some implementations, the depth a of a stress relief trench 224 is less than the width b of the stress relief trench 224. An example range for a depth a of a stress relief trench 224 may be within a range from approximately 1 $\mu$m to approximately 5 $\mu$m.

In some implementations, all of the stress relief trenches 224 may have approximately the same depth a and/or the same width b. In some implementations, two or more stress relief trenches 224 may have different depths a and/or different widths b. Moreover, the spacing c between adjacent stress relief trenches 224 may be the same for all stress relief trenches or may be different for at least a subset of the stress relief trenches 224.

The pellicle frame 220 may be attached, bonded, glued, or otherwise secured to the photomask frame 230 by a buffer layer 226. The buffer layer 226 may be formed of an adhesive material such as a thermal plastic elastomer or other macromolecular adhesive material cured by heat or drying. In some implementations, the buffer layer 226 includes Styrene Ethylene/Butylene Styrene rubber (SEBS), Thermoplastic Polyester Elastomer (TPE), polyether urethane (TPU), Thermoplastic Olefinic elastomer (TPO), Thermoplastic Vulcanisate (TPV), or another adhesive material.

The photomask frame 230 may hold and/or support the pellicle frame 220 and the pellicle 210. The photomask frame 230 may be used to mount the pellicle frame 220 and the pellicle 210 to the photomask 240. The height of the pellicle frame 220 and the photomask frame 230 may be configured such that particles and/or other debris that lands on the surface of the pellicle 210 are out of focus during a lithography exposure process and are not transferred to the wafer.

The photomask frame 230 may include one or more components to reduce the transfer of force between the pellicle frame 220 and the photomask 240, to allow for ventilation of the internal cavity of the photomask assembly 200 between the pellicle 210 and the photomask 240, and/or the like. For example, the photomask frame 230 may include a bracket 232 that is mounted to a sidewall 234. A filter 236 may be placed between the bracket 232 and the sidewall 234 to allow for ventilation and pressure balance in the internal cavity during pressurization of the exposure tool. Moreover, the photomask frame 230 may include a gasket 238 to provide structural isolation between the photomask frame 230 and the photomask 240. The gasket 238 may reduce or prevent vibration and/or other mechanical stresses from being transferred from the photomask frame 230 to the photomask.

The photomask frame 230 may be attached, bonded, glued, or otherwise secured to the photomask 240 by a buffer layer 242. The buffer layer 242 may be formed of an adhesive material such as a thermal plastic elastomer or other macromolecular adhesive material cured by heat or drying. In some implementations, the buffer layer 242 includes Styrene Ethylene/Butylene Styrene rubber (SEBS), Thermoplastic Polyester Elastomer (TPE), polyether urethane (TPU), Thermoplastic Olefinic elastomer (TPO), Thermoplastic Vulcanisate (TPV), or another adhesive material.

The photomask 240 may include a pattern that is to be transferred to a resist layer on the wafer during a lithography patterning process. The photomask 240 may be formed by one or more photomask fabrication processes, such as a mask blank fabrication process, a mask patterning process, and/or the like. During a mask blank fabrication process, a mask blank is formed by depositing suitable layers (e.g., a plurality of reflective layers, a plurality of refractive layers, and/or the like) on a suitable substrate. In some implementations, the surface roughness of the mask blank is less than approximately 50 nm.

A capping layer (e.g., ruthenium) may be formed over the multilayer coated substrate followed by deposition of an absorber layer. The mask blank may then be patterned (e.g., the absorber layer is patterned) to form a desired pattern on the photomask 240. In some implementations, an anti-reflective coating (ARC) layer may be deposited over the absorber layer prior to patterning the mask blank. The patterned photomask 240 may then be used to transfer circuit and/or device patterns onto the wafer.

In some implementations, the photomask 240 may be fabricated to include different structure types such as, for example, a binary intensity mask (BIM) or a phase-shifting mask (PSM). An example BIM includes opaque absorbing regions and reflective regions, where the BIM includes a pattern (e.g., an integrated circuit pattern) to be transferred to the wafer. The opaque absorbing regions include an absorber that is configured to absorb incident light (e.g., incident EUV light). In the reflective regions, the absorber may be removed (e.g., during the mask patterning process described above) and the incident light is reflected by the multilayer. Additionally, in some implementations, the photomask 240 may be a PSM which utilizes interference produced by phase differences of light reflected therefrom. Examples of PSMs include an alternating PSM (AltPSM), an attenuated PSM (AttPSM), or a chromeless PSM (cPSM), among other examples. An AltPSM may include phase shifters (of opposing phases) disposed on either side of each patterned mask feature. In some examples, an AttPSM may include an absorber layer having a transmittance greater than zero (e.g., approximately a 6% intensity transmittance). In some cases, a cPSM may be described as a 100% transmission AltPSM, for example, because the cPSM does not include phase shifter material or chrome on the mask. In some implementations, the patterned layer of a PSM is a reflective layer with a material stack similar to that of a multi-layer structure.

In some implementations, the photomask assembly 200 includes other components, different components, and/or differently arranged components depending on the type of exposure tool in which the photomask assembly 200 is to be used. For example, if the photomask assembly 200 is to be used in a refractive-based exposure tool (e.g., a tool in which radiation energy is to travel through the photomask assembly 200), the photomask assembly 200 may include a transparent substrate and an absorption layer that is patterned to have one or more openings through which the radiation energy may travel without being absorbed by the absorption layer. As another example, if the photomask assembly 200 is to be used in a reflective-based exposure tool (e.g., an exposure tool in which radiation energy is to be reflected off of the photomask assembly 200), the photomask assembly 200 may include a substrate coated with a plurality of films to provide a reflective mechanism. In these cases, the photomask assembly 200 may include a plurality of alternating layers of silicon and molybdenum deposited on a substrate to act as a Bragg reflector that maximizes the reflection of the radiation energy.

The number and arrangement of components, structures, and/or layers shown in FIG. 2 are provided as one or more examples. In practice, there may be additional components, structures, and/or layers; fewer components, structures, and/or layers; different components, structures, and/or layers; and/or differently arranged components, structures, and/or layers than those shown in FIG. 2.

FIGS. 3A-3I are diagrams illustrating one or more example implementations 300 described herein. In some implementations, example implementation(s) 300 may be example implementation(s) of forming a photomask assembly, such as the photomask assembly 200 of FIG. 2 and/or other photomask assemblies having stress relief trenches formed therein.

Figure 3A:
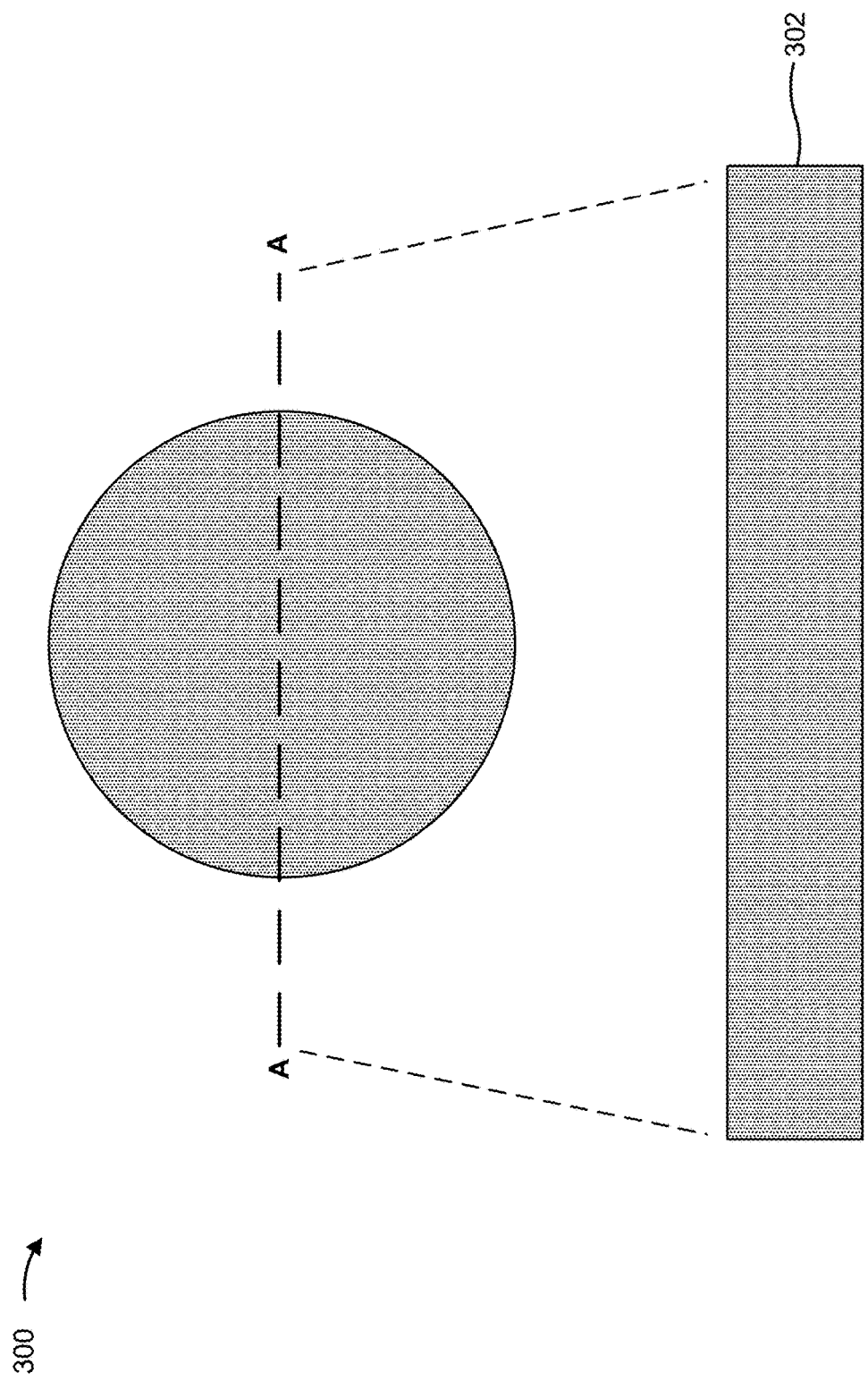
FIGS. 3A-3I are diagrams of one or more example implementations described herein.

FIG. 3A illustrates a top-down view and a cross-sectional view along line AA of a substrate 302. The substrate 320 may include a wafer (e.g., a 200 mm wafer, a 300 mm wafer, and/or the like) formed of silicon, crystal silicon, polycrystalline silicon, amorphous silicon, or another material.

Figure 3B:
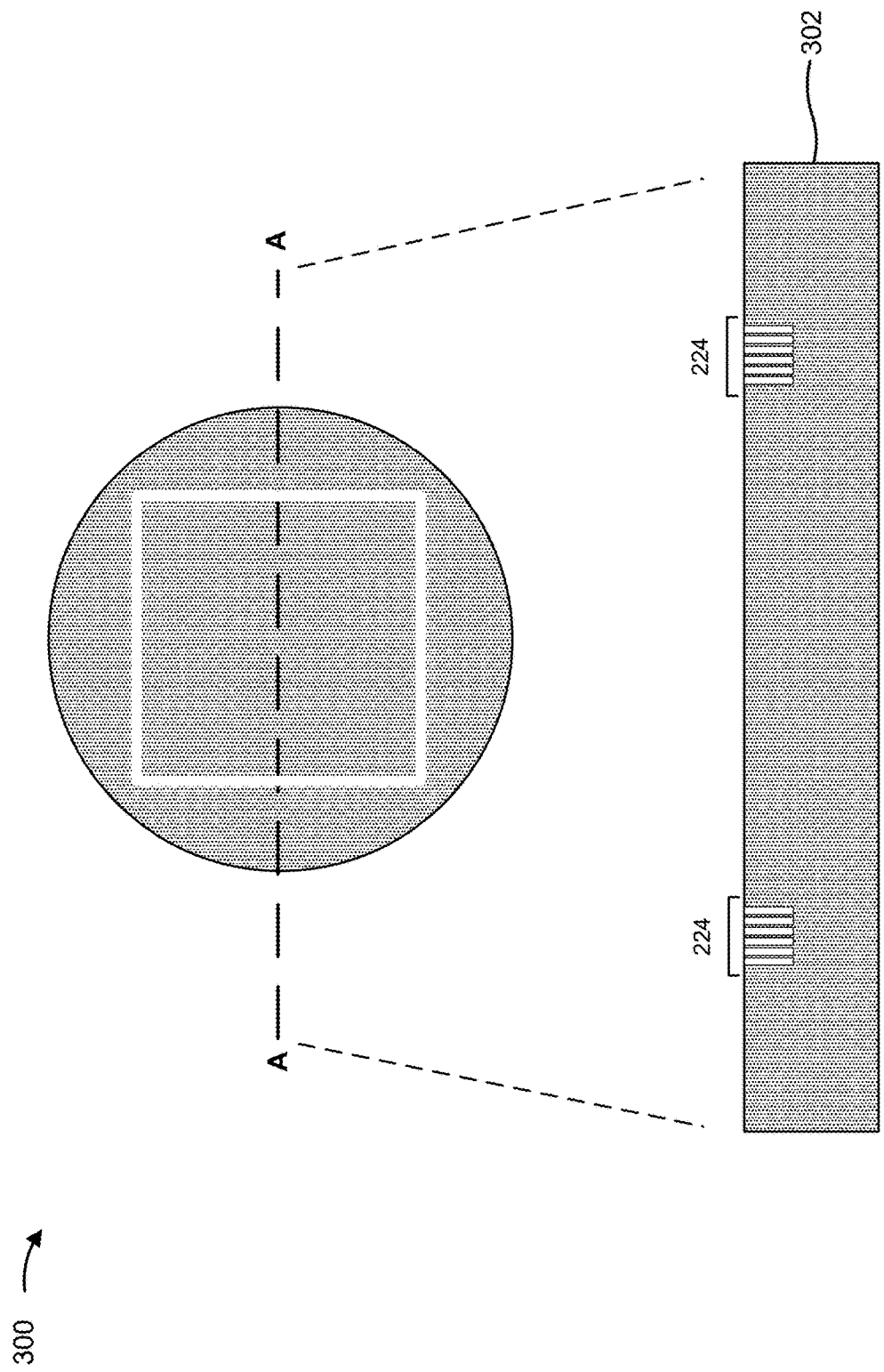

FIG. 3B illustrates another top-down view and another cross-sectional view along the line AA of the substrate 302. As shown in FIG. 3B, one or more semiconductor processing tools may form one or more stress relief trenches 224 in the substrate 302. For example, the deposition tool 102 may form a photoresist layer on the substrate 302, the exposure tool 104 may expose the photoresist layer to a radiation source to pattern the photoresist layer, the developer tool 108 may develop and remove portions of the photoresist layer to expose the pattern, the etch tool 106 may etch the one or more portions of substrate 302 to form the one or more stress relief trenches 224 in the substrate 302, and the photoresist removal tool 110 may remove the remaining portions of the photoresist layer (e.g., using a chemical stripper and/or another technique) after the etch tool 106 etches the substrate 302.

In some implementations, the one or more semiconductor processing tools may form the one or more stress relief trenches 224 based on one or more parameters. The one or more parameters may include, for example, one or more of the parameters described above in connection with FIG. 2, such as an overall width across the one or more stress relief trenches 224, an individual width for each stress relief trench 224, an individual depth for each stress relief trench 224, a spacing between adjacent stress relief trenches 224, and/or the like. Additionally, or alternatively, the one or more parameters may include a quantity of the one or more stress relief trenches 224, a shape of the stress relief trenches, or a cross-sectional profile of the one or more stress relief trenches 224, among other examples. Additionally, or alternatively, the one or more parameters may be based on an estimated width of the pellicle frame 220 for the pellicle assembly 200, an estimated height of the pellicle frame 220, a material of the pellicle frame 220, a thickness of the pellicle 210, an estimated pressure for a lithography patterning process in which the pellicle assembly 200 is to be used, a target amount of deflection for the pellicle frame, a width of the internal cavity of the pellicle assembly 200, and/or the like.

Figure 3C:
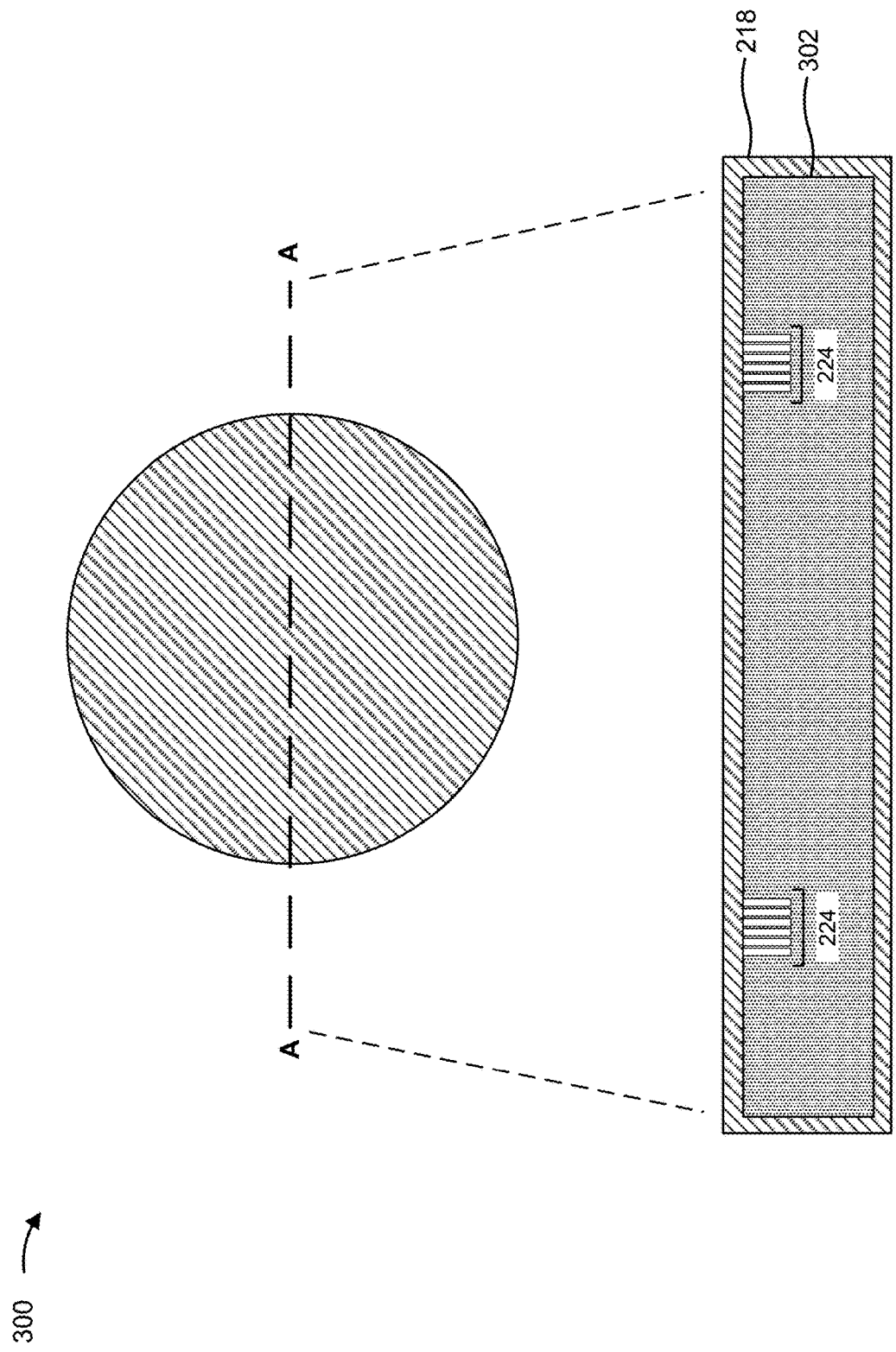

FIG. 3C illustrates another top-down view and another cross-sectional view along the line AA of the substrate 302. As shown in FIG. 3C, one or more semiconductor processing tools may form a barrier layer 218. For example, the deposition tool 102 may form the barrier layer 218 by a deposition process, such as a spin-coating process, a PVD process, a CVD process, or another type of deposition process. In some implementations, the deposition tool 102 forms the barrier layer 218 on a top surface of the substrate 302. In some implementations, the deposition tool 102 forms the barrier layer 218 around the substrate 302 (e.g., on the top surface, the bottom surface, and on or more side surfaces).

Figure 3D:
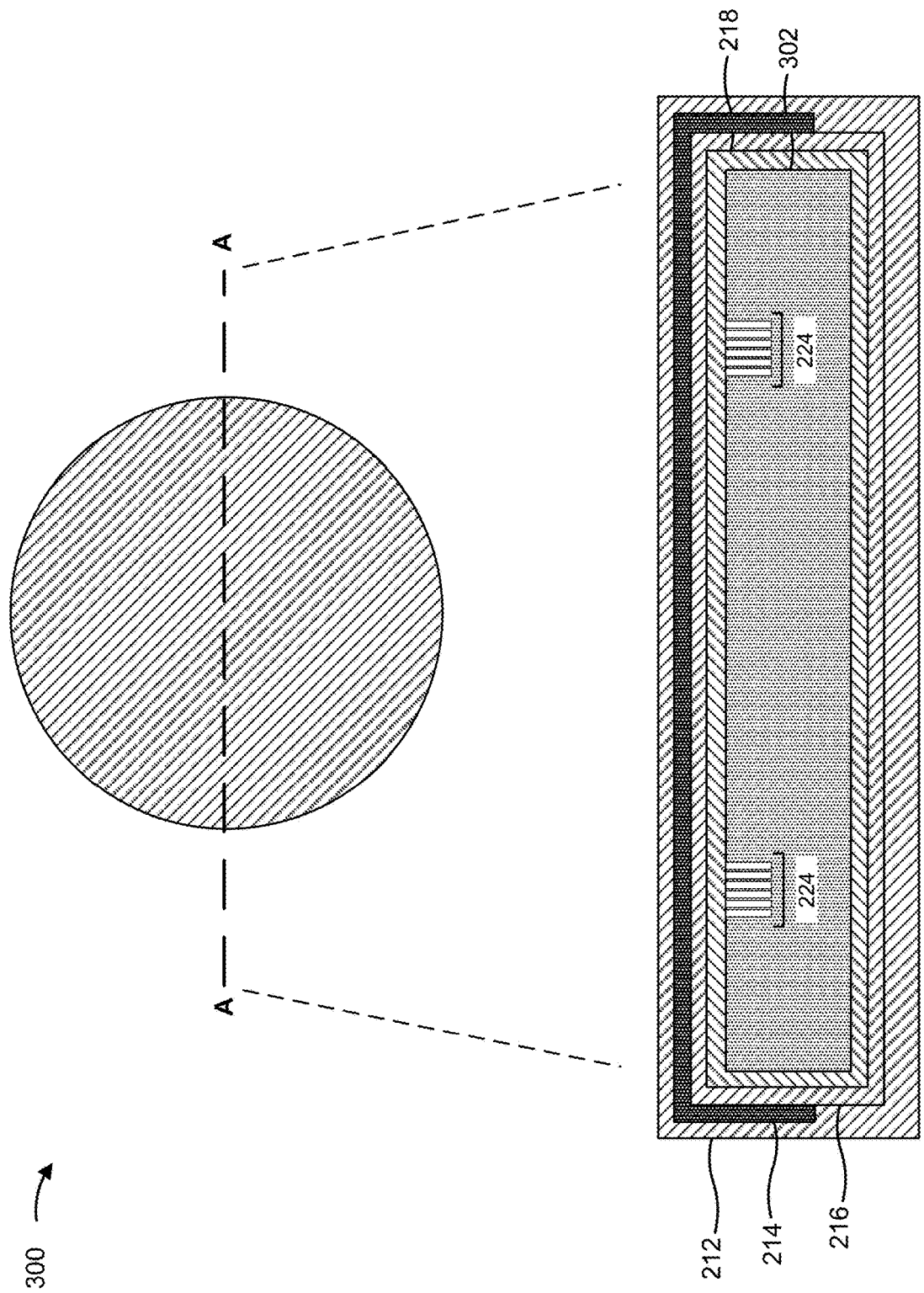

FIG. 3D illustrates another top-down view and another cross-sectional view along the line AA of the substrate 302. As shown in FIG. 3D, one or more semiconductor processing tools may form a plurality of layers to form a pellicle 210. For example, the deposition tool 102 may form the plurality of layers by a deposition process, such as a spin-coating process, a PVD process, a CVD process, or another type of deposition process. In some implementations, the deposition tool 102 forms the plurality of layers on a top surface of the barrier layer 218 and over the top surface of the substrate 302. In some implementations, the deposition tool 102 forms the plurality of layers on the barrier layer 218 and around the substrate 302 (e.g., over the top surface, over the bottom surface, and over or more side surfaces).

In some implementations, the deposition tool 108 may form the plurality of layers of the pellicle 210 by forming a capping layer 216 on at least a portion of the barrier layer 218, forming a function layer 214 on at least a portion of the capping layer 216, and forming a capping layer 212 on at least a portion of the function layer 214 (and in some implementations, on a portion of the capping layer 216).

Figure 3E:
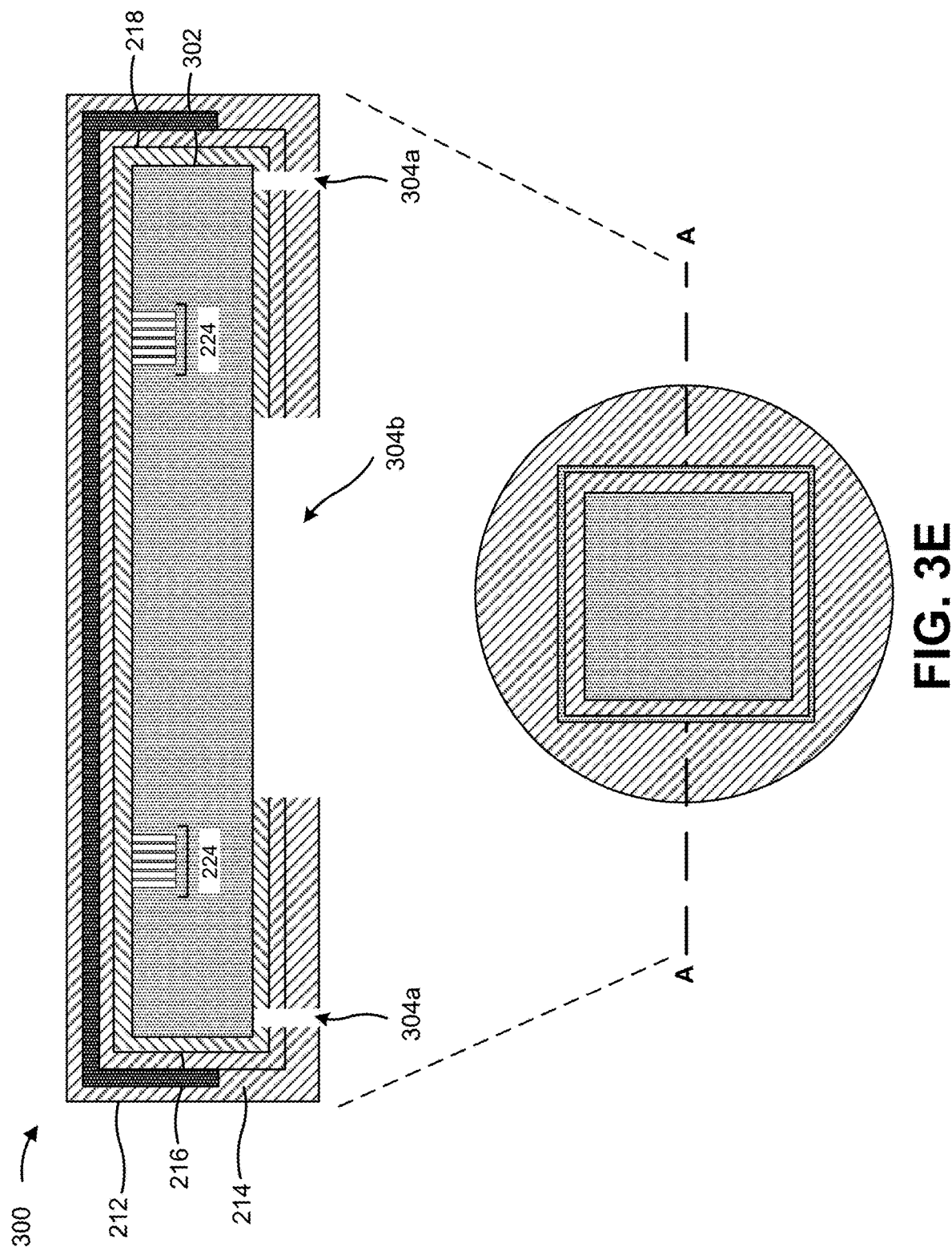

FIG. 3E illustrates a bottom-up view and another cross-sectional view along the line AA of the substrate 302. As shown in FIG. 3E, one or more semiconductor processing tools may etch a plurality of openings 304 into the pellicle 210 and the barrier layer 218 on the bottom side of the substrate 302 to define an inner perimeter and an outer perimeter of the pellicle assembly 200. For example, the etch tool 106 may etch an opening 304a into the pellicle 210 and the barrier layer 218 to define an outer perimeter of the pellicle assembly 200. For example, the etch tool 106 may etch an opening 304b into the pellicle 210 and the barrier layer 218 to define an inner perimeter of the pellicle assembly 200.

Figure 3F:
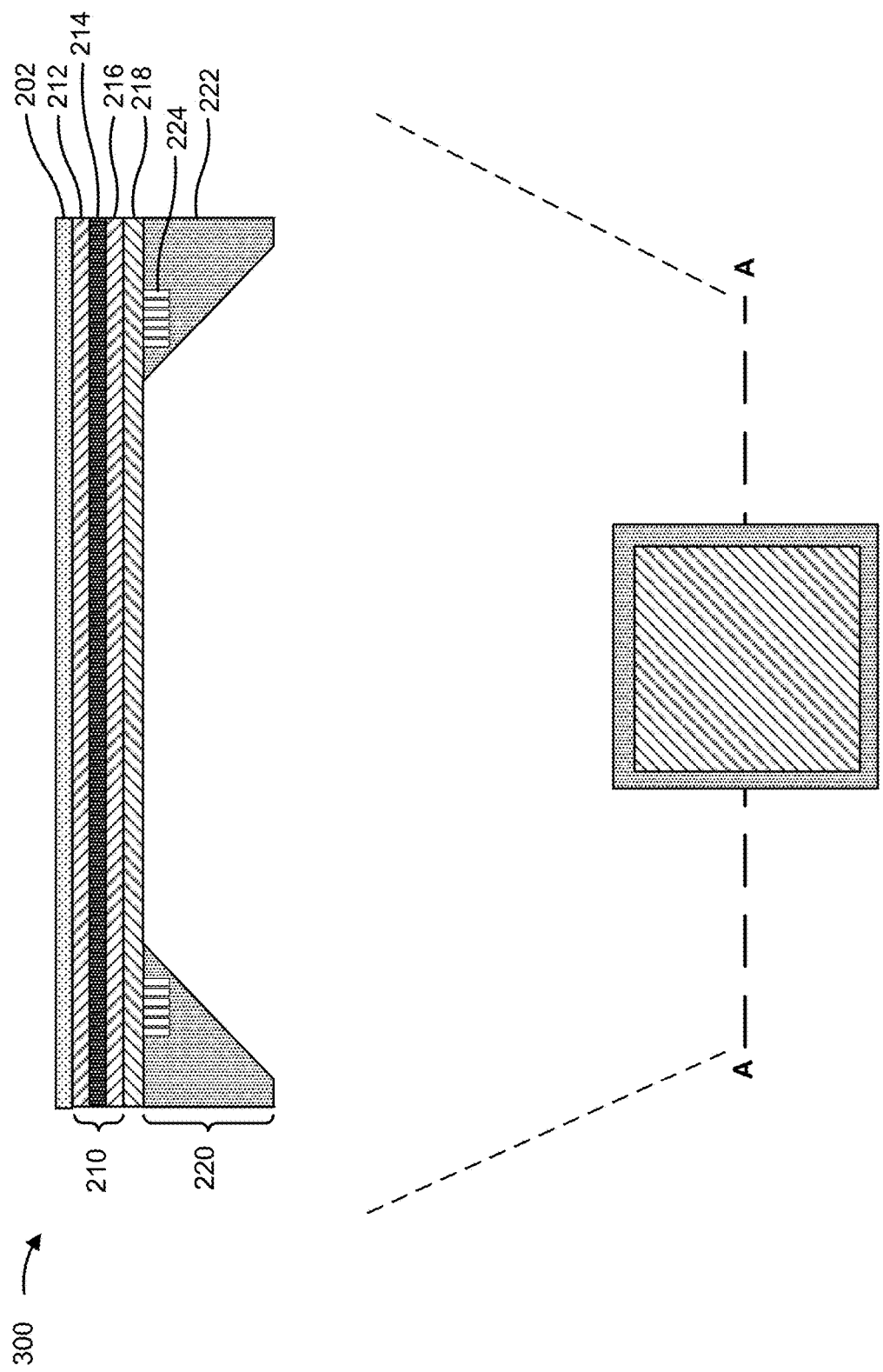

FIG. 3F illustrates another bottom-up view and another cross-sectional view along the line AA of the substrate 302. As shown in FIG. 3F, one or more semiconductor processing tools may etch through the substrate 302 from the bottom of the substrate 302 to define the pellicle frame 220. For example, the etch tool 106 may etch through the substrate 302 from the opening 304a to define an outer surface 222b, may etch through the substrate 302 from the opening 304b to define an inner surface 222a, and/or the like. Moreover, the etch tool 106 may etch through the barrier layer 218 on the top side of the substrate 302 and the layers of the pellicle 210 on the top side of the substrate 302 from the opening 304a to define the perimeter of the pellicle 210.

Figure 3G:
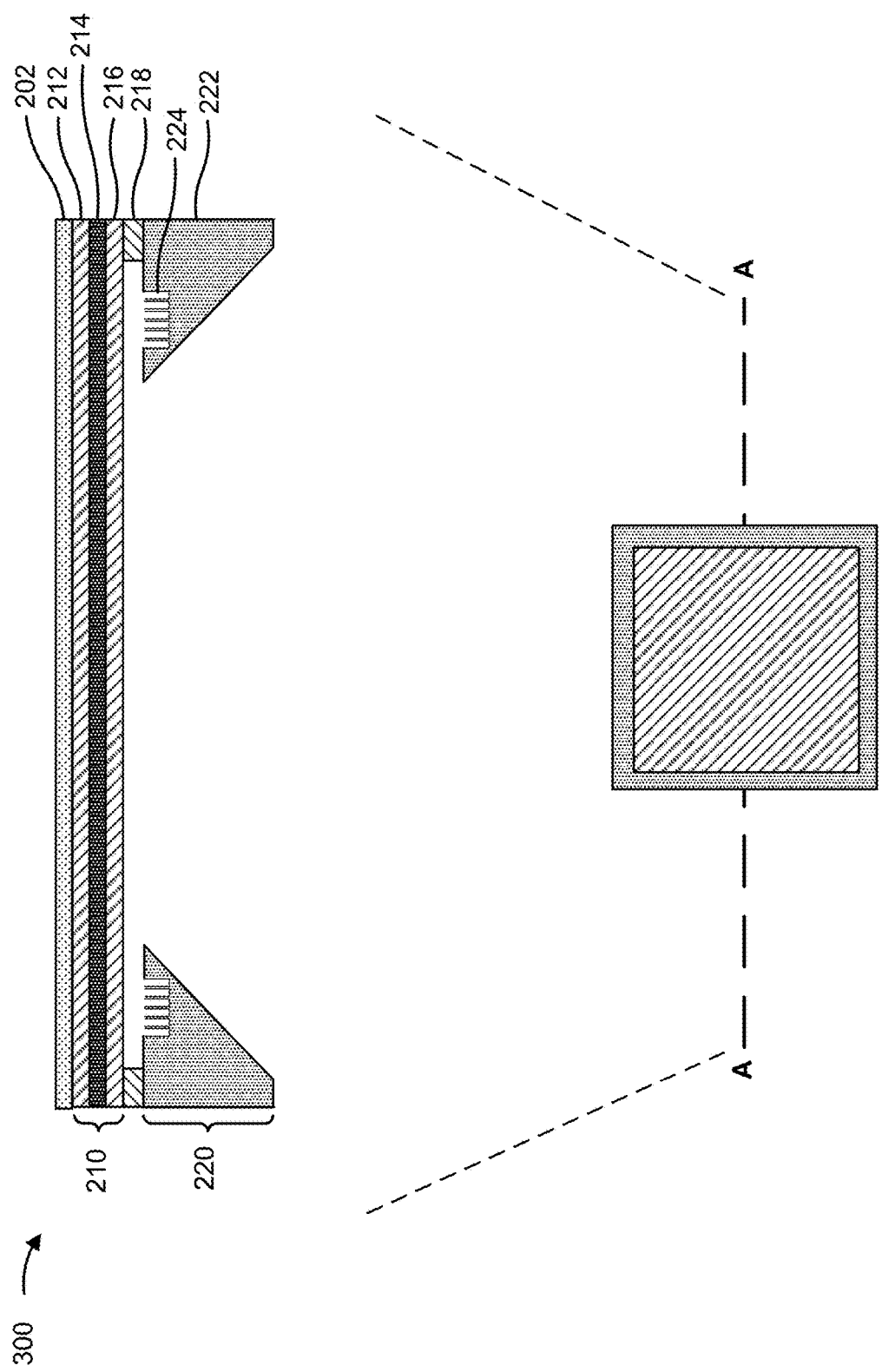

FIG. 3G illustrates another bottom-up view and another cross-sectional view along the line AA of the substrate 302. As shown in FIG. 3G, one or more semiconductor processing tools may remove a portion of the buffer layer 218 from a bottom side of the capping layer 216. For example, the etch tool 106 may perform a plasma etch (e.g., an isotropic plasma etch) to remove the portion of the buffer layer 218 between the inner surface 222a of the pellicle frame 220. Moreover, the etch tool 106 may etch a portion of the buffer layer 218 between the top surface 222c of the pellicle frame 220 and the bottom surface of the buffer layer 216. In particular, the etch tool 106 may etch the portion of the buffer layer 218 between the portion of the top surface 222c in the pellicle frame 220 in which the one or more stress relief trenches 224 were formed. The deposition of the buffer layer 218 on the portion of the top surface 222c in the pellicle frame 220 in which the one or more stress relief trenches were formed may cause material of the buffer layer 218 to fill at least a portion of the one or more stress relief trenches 224. Accordingly, etching the portion of the buffer layer 218 between the portion of the top surface 222c in the pellicle frame 220 in which the one or more stress relief trenches 224 were formed also removes the material of the buffer layer 218 from the one or more stress relief trenches 224.

Figure 3H:
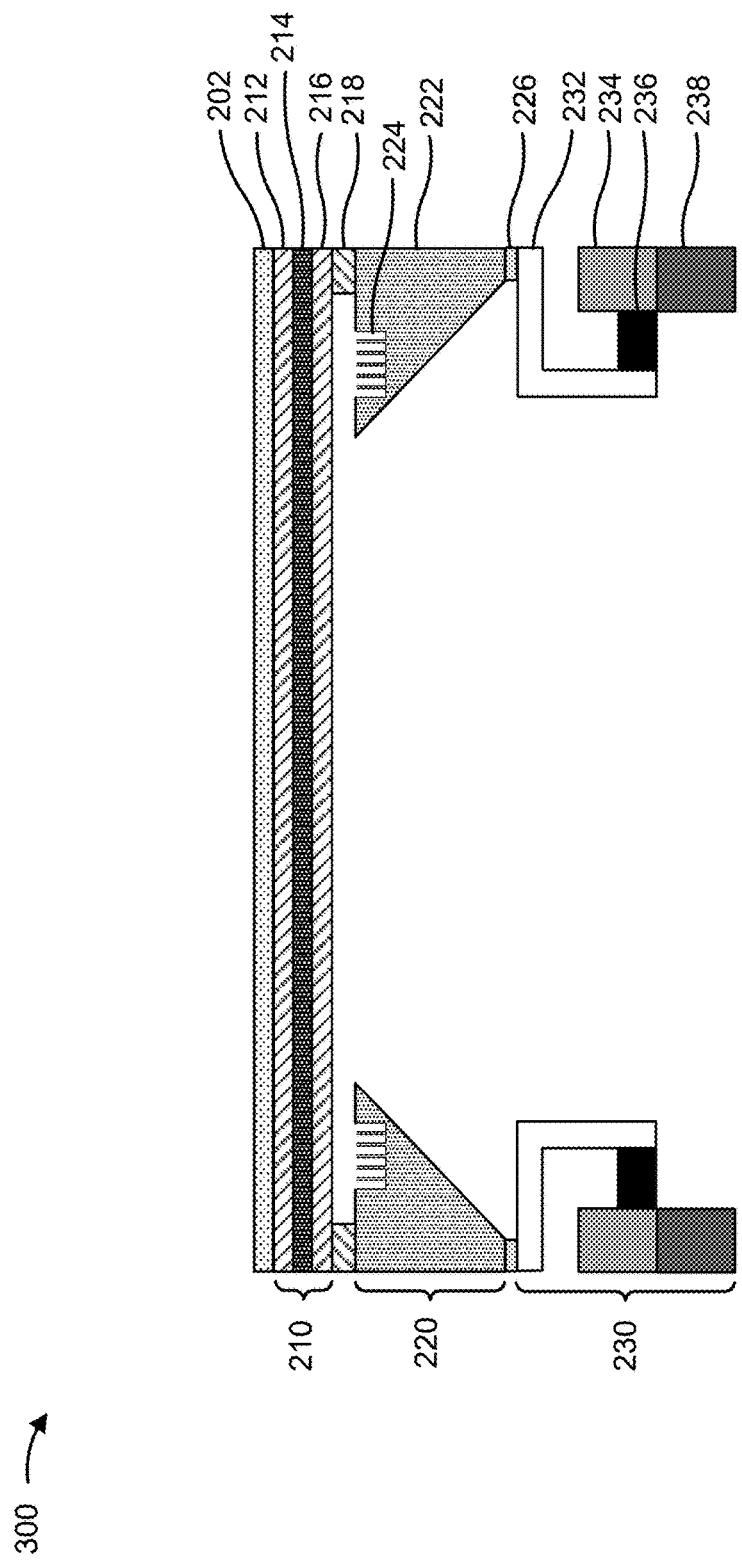
Figure 3I:
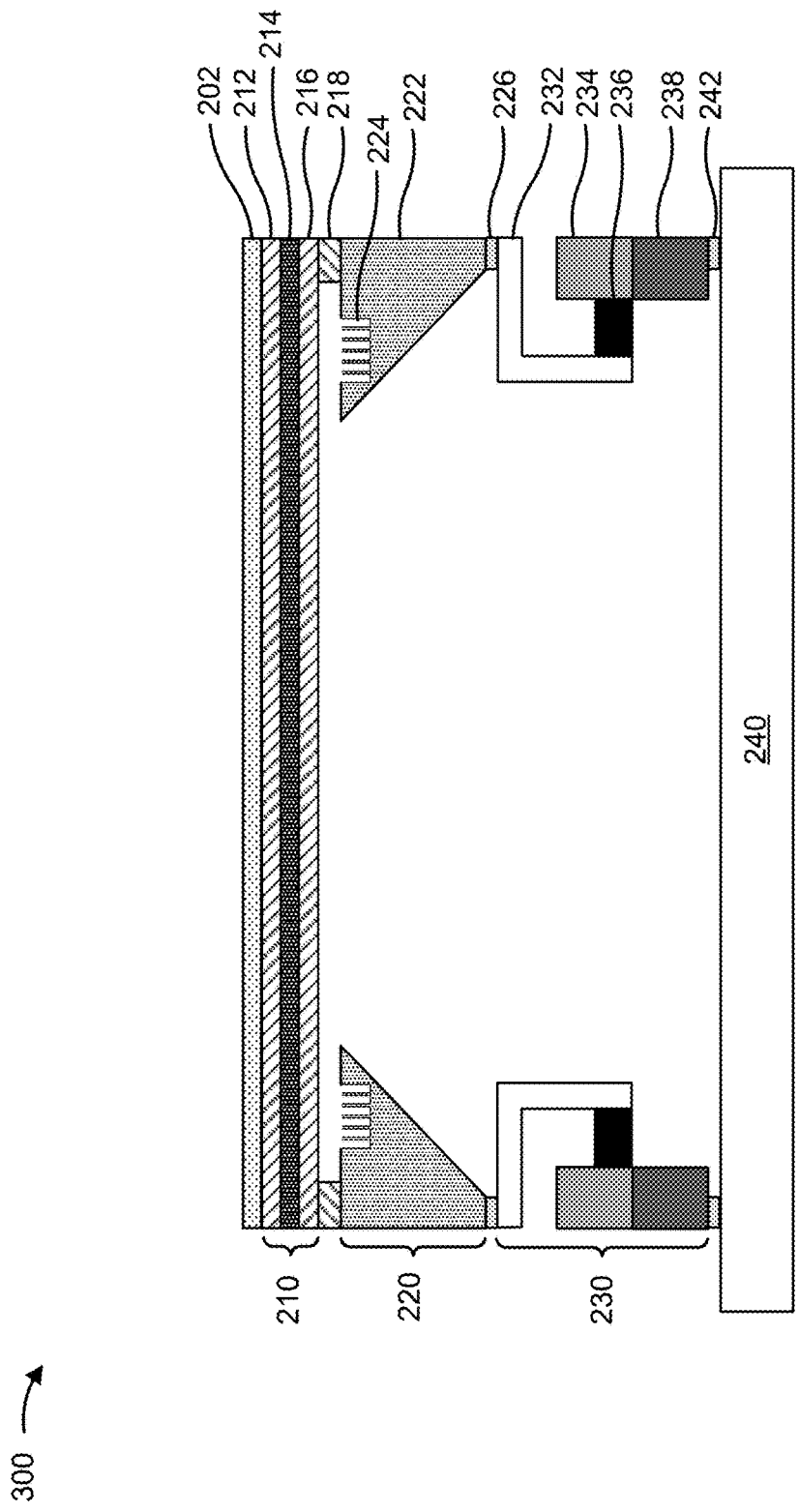

As shown in FIG. 3H, a photomask frame 230 may be attached to the photomask assembly 200. Attaching the photomask frame 230 to the photomask assembly 200 may include attaching a bracket 232 to a bottom of the pellicle frame 220 using a buffer layer 226, attaching the bracket 232 to a sidewall 234 with a filter 236 disposed between the bracket 232 and the sidewall 234, and attaching the sidewall to a gasket 238. As shown in FIG. 3I, a photomask 240 may be attached to the photomask frame 230. For example the photomask 240 may be attached to the photomask frame 230 using a buffer layer 242.

As indicated above, FIGS. 3A-3I are provided as one or more examples. Other examples may differ from what is described with regard to FIGS. 3A-3I.

FIG. 4 is a diagram illustrating an example exposure tool 400. In some implementations, the exposure tool 400 may be an example of an exposure tool in which a photomask assembly, such as the photomask assembly 200 of FIG. 2 and/or other photomask assemblies having stress relief trenches formed therein may be used. As shown in FIG. 4, the exposure tool 400 may include an exposure source (or radiation source) 402 that emits radiation energy 404, a plurality of optical components (e.g., optical component 406, optical component 408, and/or the like), a photomask stage 410 configured and designed to secure the photomask assembly 200, and a wafer stage 412 that is configured to secure a wafer 414. The exposure tool 400 may be designed to perform a lithography exposure process in a suitable mode, such as a step-and-scan mode, a scanning mode, a stepping mode, and/or the like.

The exposure source 402 may include any suitable light source, such a UV light source, a deep UV (DUV) source, an extreme UV (EUV) source, an X-ray source, and/or the like. In some implementations, the exposure source 402 may include a mercury lamp having a wavelength of approximately 436 nm or approximately 365 nm, a Krypton Fluoride (KrF) excimer laser with a wavelength of approximately 248 nm, an Argon Fluoride (ArF) excimer laser with a wavelength of approximately 193 nm, a Fluoride ($F_2$) excimer laser with a wavelength of approximately 157 nm, or another light source having a desired wavelength (e.g., below approximately 100 nm). In some implementations, the light source is an EUV source having a wavelength of approximately 13.5 nm or less.

The optical components 406 and 408 may receive the radiation energy 404 from the exposure source 402, may modulate the radiation energy 404 through the pattern of the photomask assembly 200, and may direct the radiation energy 404 to a resist layer coated on the wafer 414. In some implementations, each of the optical components 406 and 408 includes one or more lenses or lens systems that are designed to have a refractive mechanism. In some implementations, such as where the exposure tool 400 is an EUV-based exposure tool, each of the optical components 406 and 408 includes one or more reflective elements or mirrors having a reflective mechanism.

The optical component 406 may include an illumination unit such as a condenser lens, a condenser mirror, and/or the like. The optical component 406 may include a single lens or a lens module having multiple lenses and/or other lens components. For example, the optical component 406 may include a micro-lens array, a shadow mask, and/or another structure designed to aid in directing radiation energy 404 from the exposure source 402 onto the photomask assembly 200.

The optical component 408 may include a projection unit such as a projection lens, a projection mirror, and/or the like. The optical component 408 may have a single lens element or a plurality of lens elements configured to provide proper illumination to the resist layer on the wafer 414. The exposure tool 400 may further include additional components such as an entrance pupil and an exit pupil to form an image of the photomask assembly 200 on the wafer 414, and/or the like.

The photomask stage 410 is configured and designed to secure the photomask assembly 200 by a clamping mechanism, such as vacuum chuck or e-chuck. The photomask stage 410 may be further designed to be operable to move for various actions, such as scanning, stepping, and/or the like. During a lithography exposing process (or exposure process), the photomask assembly 200 may be secured on the photomask stage 410 and positioned such that an integrated circuit pattern (or a layer of a pattern) defined thereon may be transferred to or imaged on the resist layer coated on the wafer 414.

The wafer stage 412 is configured and designed to secure the wafer 414. The wafer stage 412 is further designed to provide various motions, such as transitional motion and/or rotational motion. In some implementations, the wafer 414 includes a semiconductor substrate having an elementary semiconductor material such as crystal silicon, polycrystalline silicon, amorphous silicon, germanium, or diamond, a compound semiconductor material such as silicon carbide or gallium arsenic, an alloy semiconductor material such as silicon germanium (SiGe), gallium arsenide phosphide (GaAsP), aluminum indium arsenide (AlInAs), aluminum gallium arsenide (AlGaAs), or gallium indium phosphorous (GaInP), or a combination thereof. The wafer 414 may be coated with the resist layer that is resistive to etch and/or ion implantation and is sensitive to the radiation energy 404.

The wafer 414 may include a plurality of fields having integrated circuits defined therein for one or more dies. During a lithography exposing process, the wafer 414 may be exposed one field at a time. For example, the exposure tool 400 scans the integrated circuit pattern defined in the photomask assembly 200 and transfers the integrated circuit pattern to one field, then steps to a next field and repeats the scanning until all of the fields of the wafer 414 are exhausted. A field includes one or more circuit dies and a frame region at a boundary area. After the lithography exposure process is applied to the resist layer coated on the wafer 414, the resist layer may be further developed by a developing chemical to form a patterned resist layer that has various openings for subsequent semiconductor processing, such as etching or ion implantation.

In some implementations, the exposure tool 400 is designed for immersion lithography. An immersion liquid, such as water, is filled in the space between the optical component 408 and the wafer stage 412 such that the optical refractive index is increased and the optical resolution of the lithography exposure process is enhanced. In some implementations, the exposure tool 400 includes various components designed and configured to provide, hold, and drain the immersion liquid.

As indicated above, FIG. 4 is provided as an example. Other examples may differ from what is described with regard to FIG. 4.

Figure 5:
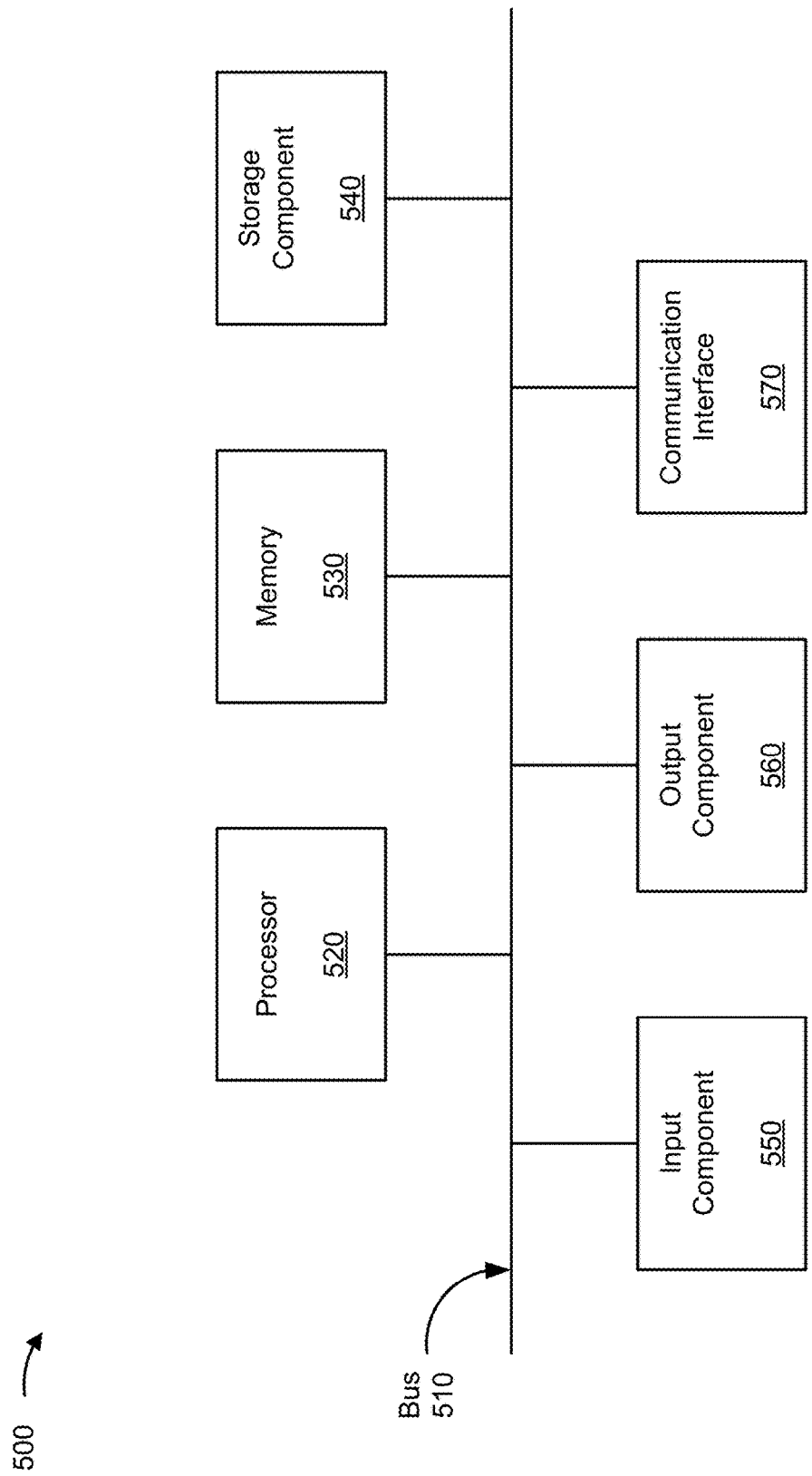
FIG. 5 is a diagram of example components of one or more devices of FIG. 1 and/or FIG. 4.

FIG. 5 is a diagram of example components of a device 500. In some implementations, the deposition tool 102, the exposure tool 104, the etch tool 106, the developer tool 108, the photoresist removal tool 110, the transport device 112, and/or the exposure tool 400 may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, an actuator, and/or the like. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, an antenna, and/or the like.

Device 500 may perform one or more processes described herein. For example, a non-transitory computer-readable medium (e.g., memory 530 and/or storage component 540) may store a set of instructions (e.g., one or more instructions, code, software code, program code, and/or the like) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
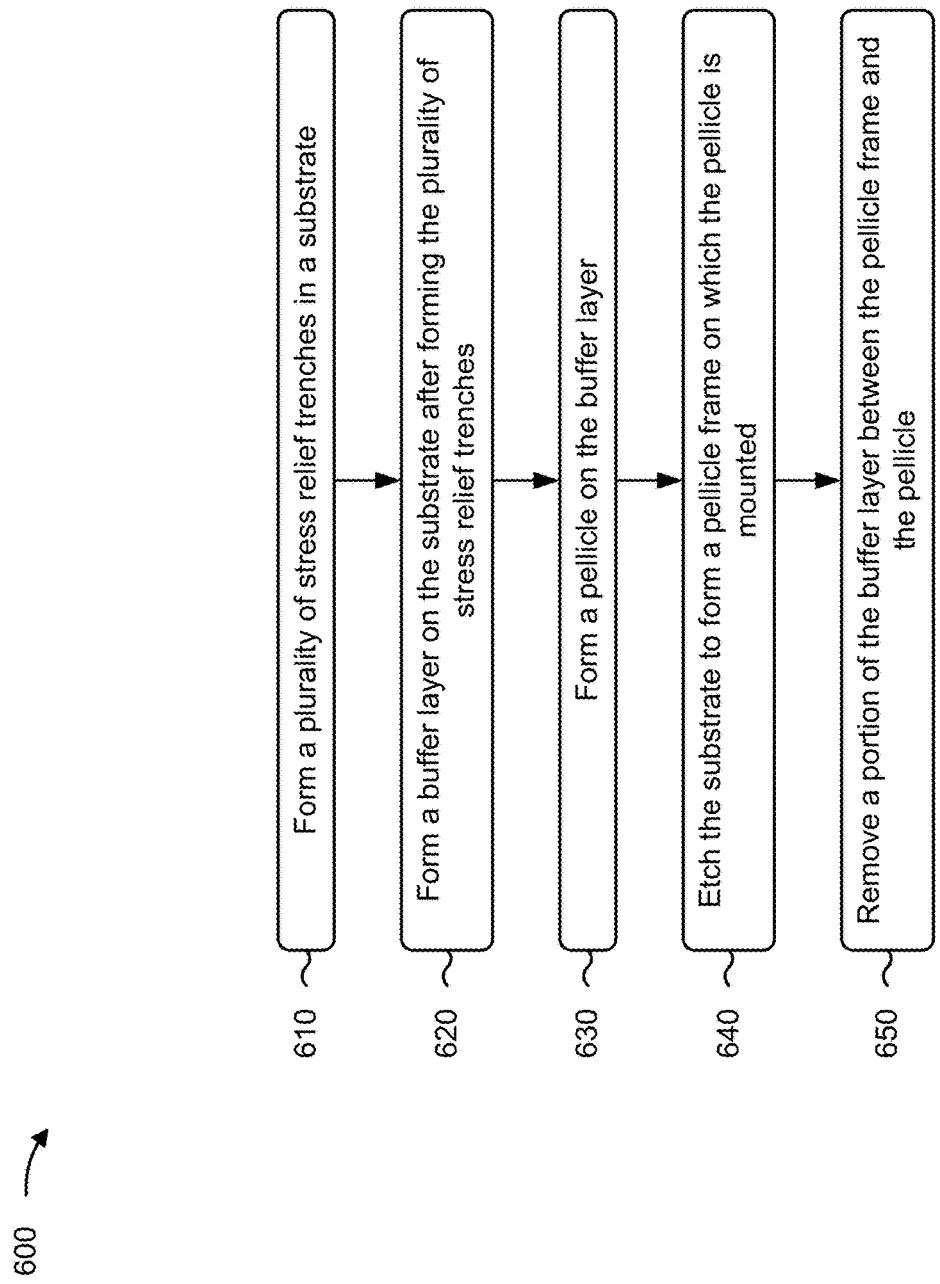
FIG. 6 is a flowchart of an example process relating to forming a photomask assembly.

FIG. 6 is a flowchart of an example process 600 associated with forming a photomask assembly. In some implementations, one or more process blocks of FIG. 6 may be performed by one or more semiconductor processing tools (e.g., one or more of the semiconductor processing tools 102-110 of FIG. 1). Additionally, or alternatively, one or more process blocks of FIG. 6 may be performed by one or more components of device 500, such as processor 520, memory 530, storage component 540, input component 550, output component 560, and/or communication interface 570.

As shown in FIG. 6, process 600 may include forming a plurality of stress relief trenches in a substrate (block 610). For example, a semiconductor processing tool (e.g., the deposition tool 102, the exposure tool 104, the etch tool 106, the developer tool 108, the photoresist removal tool 110, and/or the like) may form a plurality of stress relief trenches (e.g., the stress relief trenches 224) in a substrate (e.g., the substrate 302), as described above.

As further shown in FIG. 6, process 600 may include forming a buffer layer on the substrate after forming the plurality of stress relief trenches (block 620). For example, a semiconductor processing tool (e.g., the deposition tool 102) may form a buffer layer (e.g., the buffer layer 218) on the substrate after forming the plurality of stress relief trenches, as described above.

As further shown in FIG. 6, process 600 may include forming a pellicle on the buffer layer (block 630). For example, a semiconductor processing tool (e.g., the deposition tool 102) may form a pellicle (e.g., the pellicle 210) on the buffer layer, as described above.

As further shown in FIG. 6, process 600 may include etching the substrate to form a pellicle frame on which the pellicle is mounted (block 640). For example, semiconductor processing tool (e.g., the etch tool 106) may etch the substrate to form a pellicle frame (e.g., pellicle frame 220) on which the pellicle is mounted, as described above.

As further shown in FIG. 6, process 600 may include removing a portion of the buffer layer between the pellicle frame and the pellicle (block 650). For example, semiconductor processing tool (e.g., the etch tool 106) may remove a portion of the buffer layer between the pellicle frame and the pellicle, as described above.

Process 600 may include additional implementations, such as any single implementation or any combination of implementations described below and/or in connection with one or more other processes described elsewhere herein.

In a first implementation, process 600 includes forming a cooling layer (e.g., the cooling 202) on the pellicle. In a second implementation, alone or in combination with the first implementation, forming the buffer layer includes forming the buffer layer around the substrate, forming the pellicle on the buffer layer includes forming the pellicle around the buffer layer, and process 600 includes etching the buffer layer and the substrate to form the pellicle frame. In a third implementation, alone or in combination with one or more of the first and second implementations, process 600 includes attaching the pellicle frame to a photomask frame (e.g., the photomask frame 230), and attaching the photomask frame to a photomask (e.g., the photomask 240).

In a fourth implementation, alone or in combination with one or more of the first through third implementations, forming the pellicle layer includes forming a first capping (e.g., the capping layer 216) layer on the buffer layer, forming a function layer (e.g., the function layer 214) on the first capping layer, and forming a second capping layer (e.g., the capping layer 212) on the function layer. In a fifth implementation, alone or in combination with one or more of the first through fourth implementations, process 600 includes removing another portion of the buffer layer between the pellicle and a portion of the pellicle frame in which the plurality of stress relief trenches are formed. In a sixth implementation, alone or in combination with one or more of the first through fifth implementations, process 600 includes removing material of the buffer layer from the plurality of stress relief trenches.

In a seventh implementation, alone or in combination with one or more of the first through sixth implementations, forming the plurality of stress relief trenches includes forming the plurality of stress relief trenches to a depth that is based on at least one of an estimated width of the pellicle frame, an estimated height of the pellicle frame, a material of the pellicle frame, a thickness of the pellicle, or a target amount of deflection for the pellicle frame.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a photomask assembly 200 may be formed such that stress relief trenches 224 are formed in a pellicle frame 220 of the photomask assembly 200. The stress relief trenches 224 may reduce or prevent damage to a pellicle 210 that may otherwise result from deformation of the pellicle 210. The stress relief trenches 224 may be formed in areas of the pellicle frame 220 to allow the pellicle frame 220 to deform with the pellicle 210, thereby reducing the amount damage to the pellicle 210 caused by the pellicle frame 220.

As described in greater detail above, some implementations described herein provide a photomask assembly. The photomask assembly includes a photomask, a pellicle frame mounted to the photomask, and a pellicle mounted to the pellicle frame. The pellicle frame includes one or more stress relief trenches.

As described in greater detail above, some implementations described herein provide a method. The method includes forming a plurality of stress relief trenches in a substrate. The method includes forming a buffer layer on the substrate after forming the plurality of stress relief trenches. The method includes forming a pellicle on the buffer layer. The method includes etching the substrate to form a pellicle frame on which the pellicle is mounted. The method includes removing a portion of the buffer layer between the pellicle frame and the pellicle.

As described in greater detail above, some implementations described herein provide an exposure tool. The exposure tool includes a radio source, one or more optical components, and a photomask assembly. The photomask assembly includes a photomask, a pellicle frame mounted to the photomask, and a pellicle frame mounted to the pellicle frame. The pellicle frame includes a plurality of stress relief trenches to permit the pellicle frame to deform along with the pellicle during operation of the exposure tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photomask assembly, comprising:
   a pellicle frame comprising a first surface having one or more stress relief trenches;
   a photomask frame, comprising:
   a bracket, that is secured to a second surface, of the pellicle frame, opposite of the first surface, and
   a filter for a cavity of the photomask assembly; and
   a photomask secured to the photomask frame.

2. The photomask assembly of claim 1, wherein the bracket is secured to a sidewall of the photomask frame.

3. The photomask assembly of claim 1, wherein the filter is attached to the bracket.

4. The photomask assembly of claim 2, wherein the filter is between the bracket and the sidewall.

5. The photomask assembly of claim 1, wherein the photomask frame further comprises a gasket.

6. The photomask assembly of claim 1, wherein the photomask is secured to the photomask frame via a buffer layer.

7. The photomask assembly of claim 1, wherein, in a cross-section of the photomask assembly, a width of the first surface of the pellicle frame is greater than a width of the second surface of the pellicle frame.

8. The photomask assembly of claim 1, wherein the first surface comprises an outer portion and an inner portion, wherein the outer portion of the first surface is used to secure the pellicle frame to a pellicle, and wherein the inner portion of the first surface comprises the one or more stress relief trenches.

9. A method for forming a photomask assembly, comprising:
- forming a pellicle frame comprising a first surface having one or more stress relief trenches; and
- securing a bracket of a photomask frame to a second surface, of the pellicle frame, opposite of the first surface, wherein the photomask frame comprises the bracket and a filter for a cavity of the photomask assembly; and
- securing a photomask to the photomask frame.

10. The method of claim 9, wherein forming the pellicle frame comprises:
- forming the one or more stress relief trenches in a substrate based on one or more parameters.

11. The method of claim 10, wherein the one or more parameters includes at least one of:
- an overall width across the one or more stress relief trenches,
- an individual width for each of the one or more stress relief trenches,
- an individual depth for of the one or more stress relief trenches, or
- a spacing between adjacent stress relief trenches of the one or more stress relief trenches.

12. The method of claim 10, wherein the one or more parameters includes at least one of:
- a quantity of the one or more stress relief trenches,
- a shape of the one or more stress relief trenches, or
- a cross-sectional profile of the one or more stress relief trenches.

13. The method of claim 10, wherein the one or more parameters includes at least one of:
- an estimated width of the pellicle frame,
- an estimated height of the pellicle frame,
- information associated with a material of the pellicle frame, or
- a target amount of deflection for the pellicle frame.

14. The method of claim 9, wherein the photomask frame is secured to a buffer layer on the second surface of the pellicle frame.

15. The method of claim 9, wherein securing the bracket of the photomask frame to the second surface of the pellicle frame comprises:
- attaching an end of the bracket to the second surface of the pellicle frame, and the method further comprising:
- attaching a side of the bracket to the filter.

16. The method of claim 15, further comprising:
- attaching the filter to a sidewall; and
- attaching the sidewall to a gasket.

17. The method of claim 9, wherein the photomask is secured to the photomask frame via a buffer layer.

18. An exposure tool, comprising:
- a radiation source;
- one or more optical components; and
- a photomask assembly, comprising:
  - a pellicle frame comprising a top surface having one or more stress relief trenches,
  - a photomask frame comprising a bracket, that is secured to a bottom surface of the pellicle frame, and a filter that is for a cavity of the photomask assembly; and
- a photomask secured to the photomask frame.

19. The exposure tool of claim 18, wherein the photomask frame further comprises a gasket.

20. The exposure tool of claim 18, wherein at least one of:
- the photomask frame is secured secured to the pellicle frame via a first buffer layer, or
- the photomask is secured to the photomask frame via a second buffer layer.

* * * * *